United States Patent
Ju et al.

(10) Patent No.: US 10,490,910 B2
(45) Date of Patent: Nov. 26, 2019

(54) ELECTRICAL CONNECTOR HAVING SOLDER POSTS WITH HEIGHTS GREATER THAN MAXIMUM WIDTHS THEREOF

(71) Applicant: LOTES CO., LTD, Keelung (TW)

(72) Inventors: Ted Ju, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/036,041

(22) Filed: Jul. 16, 2018

(65) Prior Publication Data

US 2019/0067837 A1 Feb. 28, 2019

(30) Foreign Application Priority Data

Aug. 24, 2017 (CN) .......................... 2017 1 0735224

(51) Int. Cl.
*H01R 12/00* (2006.01)
*H05K 1/00* (2006.01)
(Continued)

(52) U.S. Cl.
CPC ............... *H01R 4/02* (2013.01); *H01R 12/58* (2013.01); *H01R 12/716* (2013.01); *H05K 3/3426* (2013.01); *H05K 3/3447* (2013.01); *H01R 43/0235* (2013.01); *H01R 43/0256* (2013.01); *H05K 2201/1075* (2013.01); *H05K 2201/10984* (2013.01)

(58) Field of Classification Search
CPC .......... H01R 12/50; H01R 4/02; H01R 12/57; H01R 43/0256; H01R 13/2442; H01R 43/0235; H05K 3/3426; H05K 2201/10984; H05K 2203/041

USPC ............................................ 439/83, 877, 751
See application file for complete search history.

(56) References Cited

U.S. PATENT DOCUMENTS 6,155,845 A * 12/2000 Lin ........................ H01R 4/028
439/78
6,501,665 B1 * 12/2002 Ted ....................... H05K 3/3426
174/257

(Continued)

FOREIGN PATENT DOCUMENTS

CN     2588619 Y     11/2003
CN     1467877 A     1/2004

(Continued)

*Primary Examiner* — Abdullah A Riyami
*Assistant Examiner* — Thang H Nguyen
(74) *Attorney, Agent, or Firm* — Locke Lord LLP; Tim Tingkang Xia, Esq.

(57) ABSTRACT

An electrical connector includes: an insulating body, provided with multiple accommodating holes; multiple terminals, respectively accommodated in the accommodating holes, where each of the terminals is provided with a clamping portion; and multiple solder posts, each being clamped by the clamping portion of one of the terminals. A height of each solder post is greater than a maximum width of each solder post. Each solder post is formed by a first base and a second base connected with each other. The clamping portion clamps the first base. The second base is located outside the clamping portion. A height of the first base and a height of the second base are both greater than one half of the maximum width of each solder post. The height of the second base is greater than 0.15 mm.

20 Claims, 7 Drawing Sheets

(51) Int. Cl.
*H01R 4/02* (2006.01)
*H01R 12/71* (2011.01)
*H01R 12/58* (2011.01)
*H05K 3/34* (2006.01)
*H01R 43/02* (2006.01)

(56) References Cited

U.S. PATENT DOCUMENTS

| | | | | |
|---|---|---|---|---|
| 6,533,590 B1 * | 3/2003 | Lee | ............ | H01R 4/027 |
| | | | | 439/83 |
| 7,001,190 B2 * | 2/2006 | Morana | ............ | H01R 13/112 |
| | | | | 439/81 |
| 7,029,292 B2 * | 4/2006 | Grabbe | ............ | H01R 12/57 |
| | | | | 439/83 |
| 7,140,886 B1 * | 11/2006 | Chen | ............ | H05K 3/3426 |
| | | | | 439/83 |
| 7,147,489 B1 * | 12/2006 | Lin | ............ | H01R 12/57 |
| | | | | 439/83 |
| 7,278,864 B2 * | 10/2007 | Tsai | ............ | H01R 12/57 |
| | | | | 439/83 |
| 7,393,214 B2 * | 7/2008 | DiStefano | ............ | H01R 13/2407 |
| | | | | 439/66 |
| 7,534,113 B2 * | 5/2009 | Liao | ............ | H01R 13/2442 |
| | | | | 439/83 |
| 7,553,202 B2 * | 6/2009 | Ma | ............ | H01R 12/57 |
| | | | | 439/839 |
| 7,682,165 B2 * | 3/2010 | Liao | ............ | H05K 3/3426 |
| | | | | 439/342 |
| 7,938,649 B2 * | 5/2011 | Gattuso | ............ | H01R 12/57 |
| | | | | 439/71 |
| 8,894,422 B2 * | 11/2014 | Yeh | ............ | H01R 12/57 |
| | | | | 439/83 |
| 9,142,932 B2 * | 9/2015 | Liaw | ............ | H01R 12/57 |
| 9,954,312 B1 * | 4/2018 | Ju | ............ | H01R 12/707 |
| 10,084,252 B1 * | 9/2018 | Ju | ............ | H01R 12/707 |

FOREIGN PATENT DOCUMENTS

| | | |
|---|---|---|
| CN | 100411253 C | 8/2008 |
| CN | 202189913 U | 4/2012 |

* cited by examiner

ELECTRICAL CONNECTOR HAVING SOLDER POSTS WITH HEIGHTS GREATER THAN MAXIMUM WIDTHS THEREOF

CROSS-REFERENCE TO RELATED PATENT APPLICATION

This non-provisional application claims priority to and the benefit of, pursuant to 35 U.S.C. § 119(a), patent application Serial No. CN201710735224.0 filed in China on Aug. 24, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to a high-density electrical connector for electrically connecting a chip module to a circuit board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector includes an insulating body, which is provided with multiple accommodating holes. Each of the accommodating holes correspondingly accommodates a terminal. The terminal is provided with a clamping portion, and the clamping portion clamps a solder ball, referring to Chinese Patent No. CN02293906.7.

However, the above-mentioned electrical connector has the defects that, in order to achieve the densification of the electrical connector, the size of the solder ball is not changed, but the distance among the accommodating holes is reduced. Since the terminals are closely arranged and a contact portion of each terminal is located above the insulating body, when the electrical connector is connected with a chip module, short-circuiting is likely to occur. If the size of the solder ball is reduced, resulting in less reduction of the distance among the accommodating holes, the missing solder phenomenon caused by the insufficiency of the solder may occur, thereby influencing the electrical connection between the electrical connector and the chip module and the circuit board.

Therefore, a heretofore unaddressed need to design an improved electrical connector exists in the art to address the aforementioned deficiencies and inadequacies.

SUMMARY

In view of the deficiencies in the background, the present invention is directed to an electrical connector in which a height of a solder post is set to be greater than a maximum width of the solder post, and the height of a first base and the height of a second base of the solder post are respectively greater than half of the maximum width, thereby not only ensuring the soldering quality, but also increasing the density of the accommodating holes.

To achieve the foregoing objective, the invention adopts the following technical solutions.

An electrical connector includes: an insulating body, provided with a plurality of accommodating holes; a plurality of terminals, respectively accommodated in the accommodating holes, wherein each of the terminals is provided with a clamping portion; and a plurality of solder posts, wherein each of the solder posts is clamped by the clamping portion of one of the terminals, a height of each of the solder posts is greater than a maximum width of each of the solder posts, each of the solder posts is formed by a first base and a second base connected with each other, the clamping portion clamps the first base, the second base is located outside the clamping portion, a height of the first base and a height of the second base are both greater than one half of the maximum width of each of the solder posts, and the height of the second base is greater than 0.15 mm.

In certain embodiments, the height of the second base is greater than 0.3 mm.

In certain embodiments, the height of the second base is greater than the height of the first base.

In certain embodiments, each of the terminals is provided with a main body portion, the main body portion is provided with a through hole, and the main body portion is correspondingly provided with two extending arms at two sides of the through hole, configured to transmit signals between a chip module and a circuit board.

In certain embodiments, a connecting portion connects the two extending arms and the clamping portion, and the connecting portion is provided with an anti-siphon structure located above the first base.

In certain embodiments, the through hole is provided with an elastic sheet, and each of the accommodating holes is provided with a stopping block configured to stop the elastic sheet.

In certain embodiments, a horizontal cross-section of each of the solder posts is a circle.

In certain embodiments, the clamping portion and the connecting portion surroundingly form an accommodating space, and the first base is located in the accommodating space; the first base is provided with a first flat surface, a first rounded chamfer connects the first flat surface and a side surface of the first base, and correspondingly, one side of the connecting portion facing the accommodating space is arc shaped and matches with the first rounded chamfer; and the second base is provided with a second flat surface, a second rounded chamfer connects the second flat surface and the side surface of the second base, and the second rounded chamfer is located outside the accommodating space.

In certain embodiments, each of the solder posts is made of one of a plurality of solder balls via a jig, the jig includes a platform and a pressing member located above the platform, the pressing member moves back and forth in a horizontal direction, the solder balls are located on the platform, and the pressing member downward abuts the solder balls.

In certain embodiments, the pressing member presses the solder balls for multiple times and gradually presses the solder balls downward so as to make the solder balls into the solder posts.

In certain embodiments, a horizontal cross-section of each of the solder posts is a polygon.

In certain embodiments, each of the accommodating holes is provided with two first side walls opposite to each other, the clamping portion is provided between the two first side walls, side surfaces of the first base face the first side walls, and a distance between the two first side walls is greater than the maximum width of each of the solder posts.

In certain embodiments, each of the accommodating holes is provided with two second side walls opposite to each other, the second side walls are connected with the first side walls, and the two second side walls and the two first side walls jointly surroundingly form the accommodating hole; and the clamping portion is provided with two clamping arms opposite to each other, the clamping arms face the second side walls, and two gaps are respectively formed between the clamping arms and the second side walls.

In certain embodiments, a distance between the two gaps is greater than the distance between the two first side walls.

In certain embodiments, the clamping portion has two clamping arms opposite to each other, a free end of each of the clamping arms faces the first base and is provided with at least one stopping portion, and the stopping portion abuts the first base.

Compared with the related art, certain embodiments of the present invention have the following beneficial effects: the height of each solder post is greater than the maximum width of each solder post, and the height of the first base and the height of the second base are both greater than a half of the maximum width of each solder post. Each solder post has a height greater than a diameter of a solder ball compared with the solder ball of a same volume, and the maximum width of the solder post is smaller than the diameter of the solder ball. Thus, the size of each accommodating hole can be reduced, and the distance among the accommodating holes is increased, such that the insulating body can realize the densification of the accommodating holes. The height of the second base is greater than 0.15 mm. That is, a collapse distance when the second base is molten is reserved to be greater than 0.15 mm, thereby ensuring the rational amount of solder and rational soldering space.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
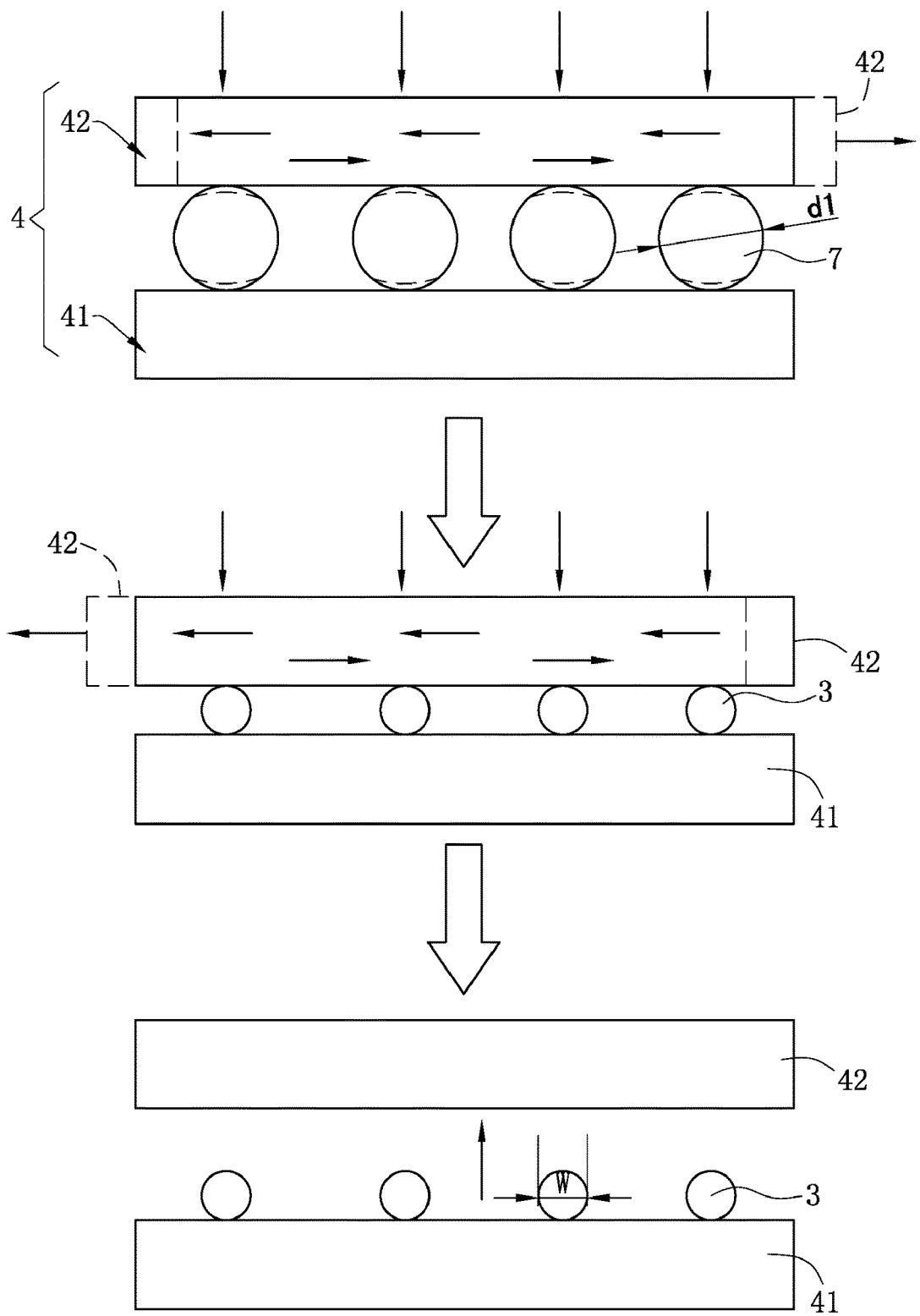
FIG. 1 is a schematic view of a process of a solder post being made of a solder ball in an electrical connector according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an electrical connector.

Figure 3:
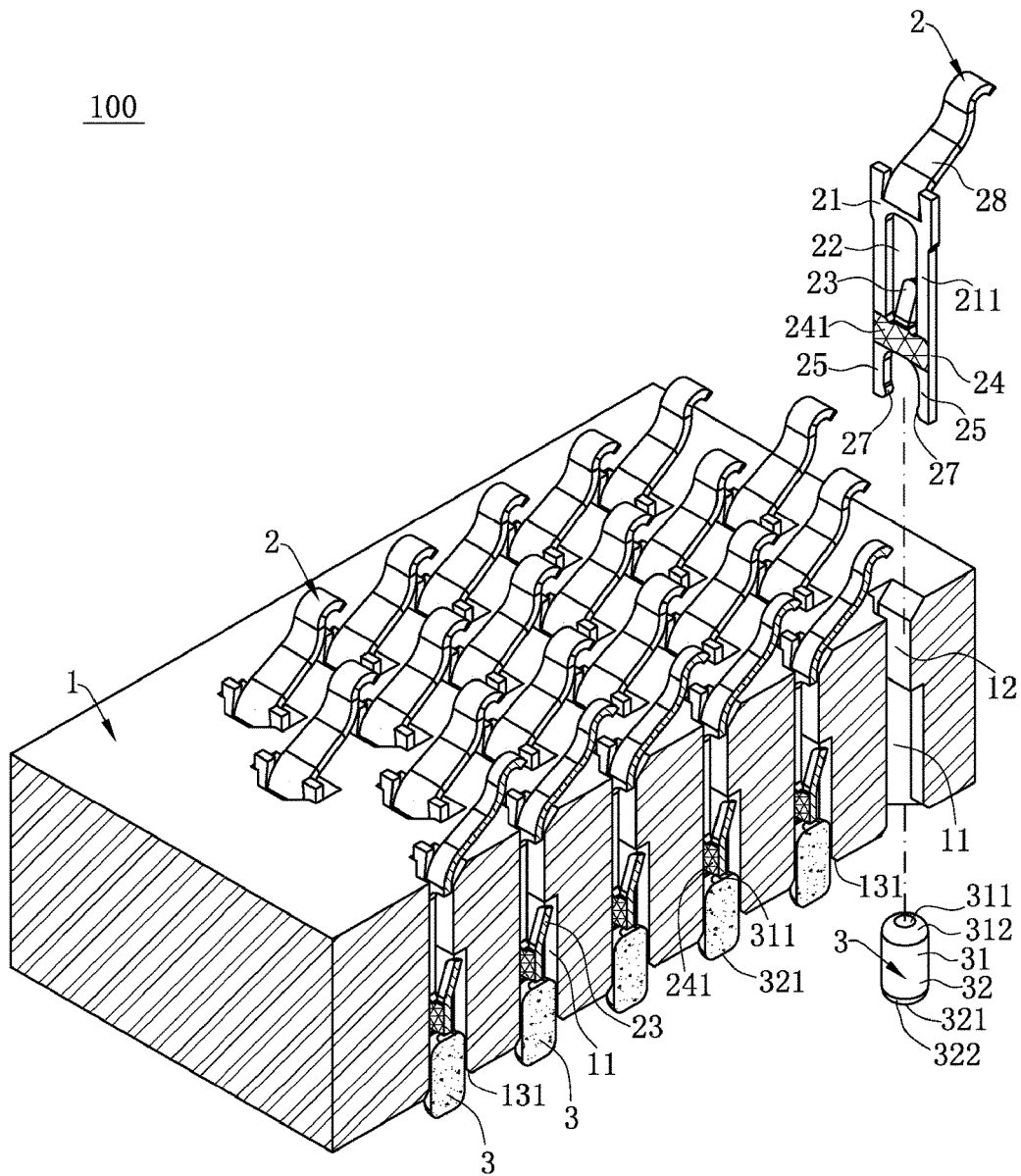
FIG. 3 is a local perspective sectional view of an electrical connector according to certain embodiments of the present invention.

As shown in FIG. 3, an electrical connector 100 according to certain embodiments of the present invention includes an insulating body 1, a plurality of terminals 2 and a plurality of solder posts 3.

Figure 4:
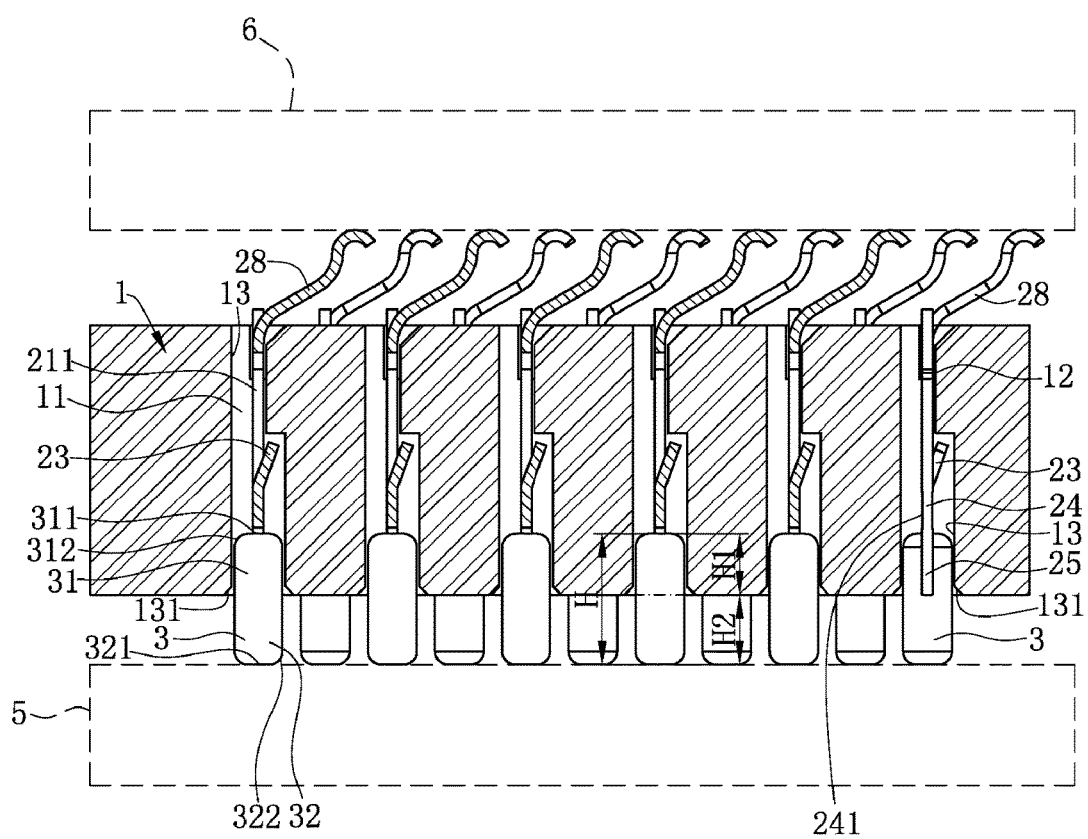
FIG. 4 is a sectional view of an electrical connector connecting an circuit board and a chip module according to certain embodiments of the present invention.
Figure 5:
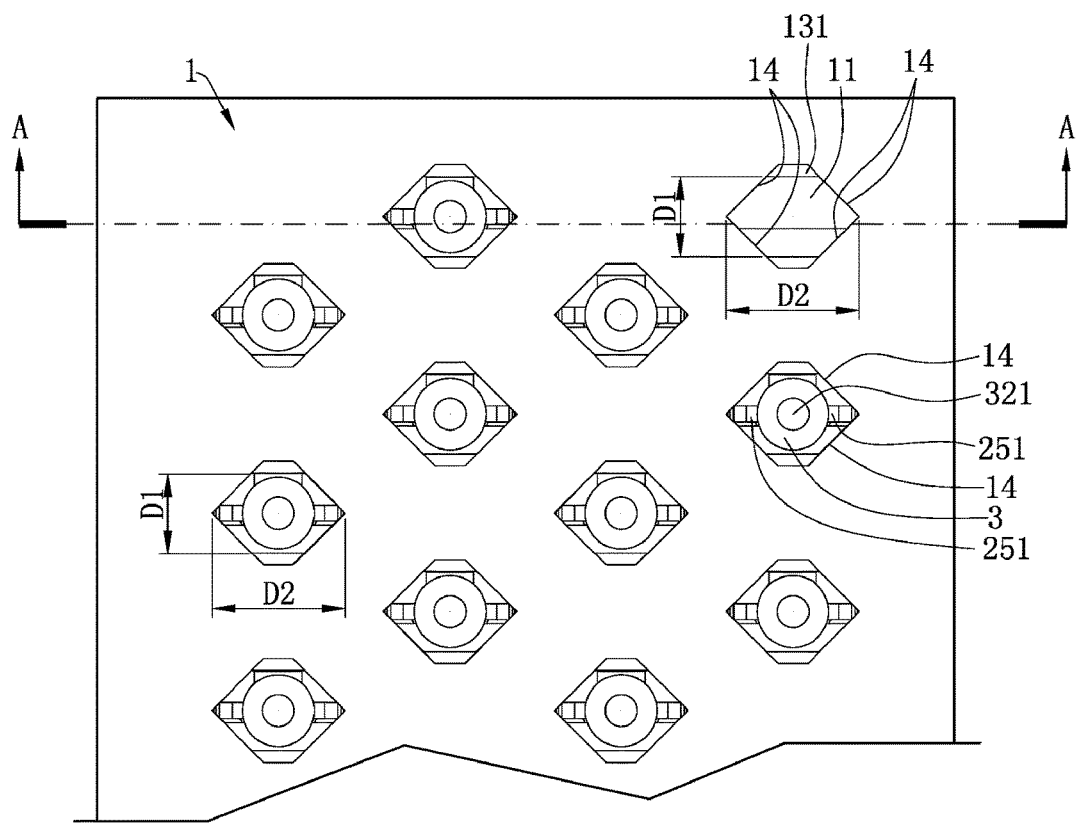
FIG. 5 is a bottom view of an electrical connector according to certain embodiments of the present invention.

As shown in FIG. 4 and FIG. 5, the insulating body 1 is provided with a plurality of accommodating holes 11. Each accommodating hole 11 accommodates one of the terminals 2, and each accommodating hole 11 is provided with a stopping block 12 and two first side walls 13 opposite to each other. Each first side wall 13 is provided with a guiding surface 131. The two guiding surfaces 131 are bottom surfaces of the first side walls 13 and obliquely face interiors of the accommodating holes 11, and are configured to guide the terminals 2 to clamp the solder posts 3 to enter the accommodating holes 11. Each accommodating hole 11 is also provided with two second side walls 14 opposite to each other. The second side walls 14 are connected with the first side walls 13, and the two second side walls 14 and the two first side walls 13 jointly surroundingly define the accommodating hole 11.

Figure 6:
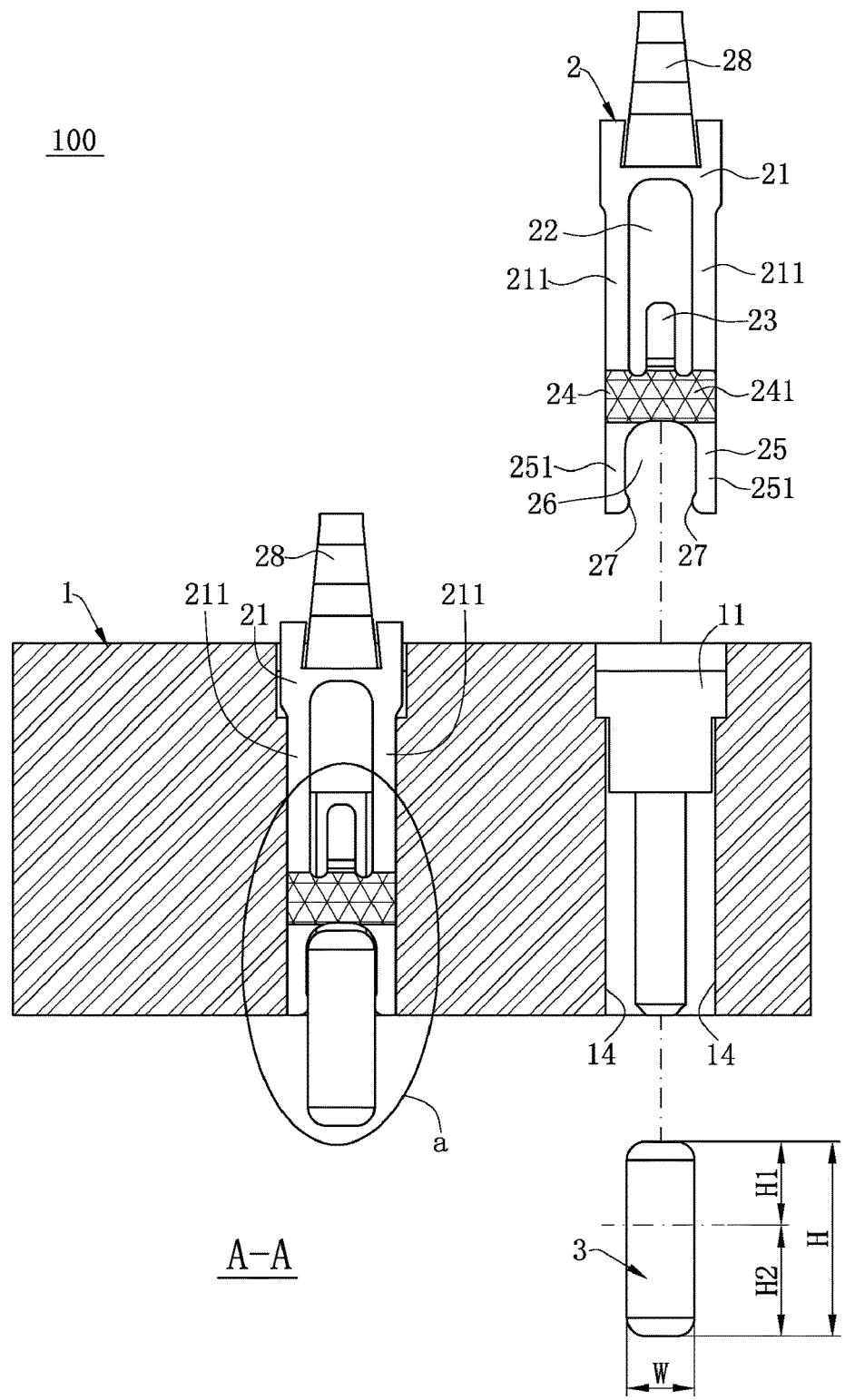
FIG. 6 is a sectional view in an A-A direction of FIG. 5.
Figure 7:
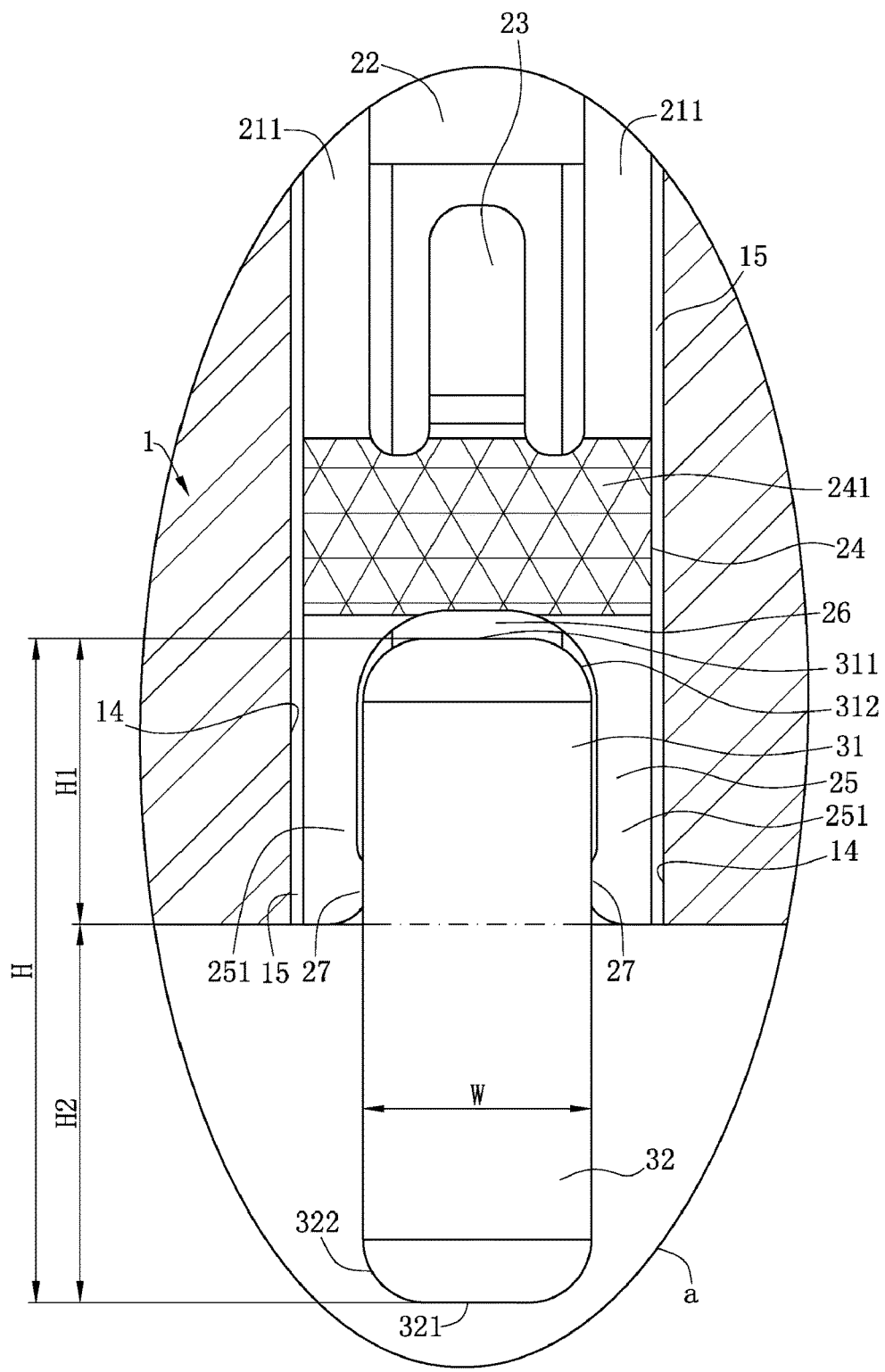
FIG. 7 is a local enlarged view of FIG. 6.

As shown in FIG. 4, FIG. 6 and FIG. 7, each terminal 2 is provided with a main body portion 21. The main body portion 21 is provided with a through hole 22, and the main body portion 21 is correspondingly provided with two extending arms 211 at two sides of the through hole 22, configured to transmit signals between a chip module 6 and a circuit board 5 and reduces an inductance thereof, thereby facilitating transmission of a high-frequency signal. The through hole 22 is provided with an elastic sheet 23. The stopping block 12 is located above the elastic sheet 23 and is configured to stop the elastic sheet 23, thereby preventing the terminal 2 from being separated from the corresponding accommodating hole 11. Each terminal 2 is provided with a connecting portion 24 and a clamping portion 25 extending downward from the connecting portion 24, and the connecting portion 24 connects the two extending arms 211 and the clamping portion 25. The connecting portion 24 is provided with an anti-siphon structure 241, and the solder post 3 is located below the anti-siphon structure 241. When the electrical connector 100 and the circuit board 5 are together put into a reflow oven (not shown) for heating the solder posts 3, the anti-siphon structure 241 can enable solder to permeate therethrough, such that the solder climbing toward the direction above the clamping portion 25 is reduced, and an anti-siphon effect can be realized. Meanwhile, more solder remains on the clamping portion 25, thereby preventing the insufficient solder phenomenon. Each terminal 2 is provided with an elastic arm 28. The elastic arm 28 extends upward out of the upper surface of the insulating body 1 from the main body portion 21 and is configured to be in contact with the chip module 6.

As shown in FIG. 4, FIG. 5 and FIG. 7, the clamping portion 25 is located between the two first side walls 13. The clamping portion 25 and the connecting portion 24 surroundingly form an accommodating space 26. The clamping portion 25 clamps a corresponding solder post 3 so as to enable the solder post 3 to be located in the accommodating space 26. The clamping portion 25 is provided with two clamping arms 251 opposite to each other. The clamping arms 251 face the second side walls 14, and two gaps 15 are respectively formed between the clamping arms 251 and the second side walls 14. When each solder post 3 is installed in the accommodating space 26, due to the presence of the gaps 15 between the clamping arms 251 and the second side walls 14, when each solder post 3 is squeezed into a space between the two clamping arms 251, the clamping arms 251 can be prevented from being forced to push against the second side walls 14. Correspondingly, the stress of the clamping arms 251 is not transferred to the insulating body 1, and the damage of the insulating body 1 is avoided. A distance D2 between the two gaps 15 is greater than the distance D1 between the two first side walls 13, and the distance D1 between the two first side walls 13 is greater than a maximum width W of the solder post 3, such that each accommodating hole 11 is sufficient to accommodate the terminal 2 and the solder post 3. A free end of each clamping arm 251 is provided with a stopping portion 27 facing a first base 31.

As shown in FIG. 4, FIG. 6 and FIG. 7, each of the solder posts 3 is clamped by one clamping portion 25. A horizontal cross-section of the solder post 3 is a circle. In other embodiments, the horizontal cross-section of the solder post 3 can also be a polygon. A height H of each solder post 3 is greater than the maximum width W of each solder post 3. Each solder post 3 is formed by a first base 31 and a second base 32 connected with each other. The clamping portion 25 clamps the first base 31. The first base 31 is located in the accommodating space 26. The second base 32 is located outside the clamping portion 25, and the second base 32 is configured to be in contact with the circuit board 5. A height H1 of the first base 31 and a height H2 of the second base 32 are both greater than one half of the maximum width W of the solder post 3. The height H1 of the first base 31 is smaller than the height H2 of the second base 32, thus ensuring that the amount of solder for connecting the clamping portion 25 and the terminal 2 and the circuit board 5 during the soldering is sufficient, and the stress on the solder post 3 when the clamping portion 25 clamps the solder post 3 is more stable. Since each solder post 3 has a height H greater than a diameter d1 of a solder ball 7 compared with the solder ball 7 of the same volume, and the maximum width W of the solder post 3 is smaller than the diameter d1 of the solder ball 7, the size of each accommodating hole 11 can be reduced, and the distance among the accommodating holes 11 is increased, such that the insulating body 1 can realize the densification of the accommodating holes 11. The side surface of the first base 31 faces the first side wall 13. The stopping portion 27 abuts the side surface of the first base 31 and is configured to stably keep the solder post 3 to be located in the accommodating space 26.

As shown in FIG. 4 and FIG. 7, the height H2 of the second base 32 is greater than 0.15 mm. That is, a collapse distance is reserved to be greater than 0.15 mm when the second base 32 is molten, thereby ensuring the rational amount of solder and rational soldering space. Since a length L of the solder ball 7 extending out of the clamping portion 25 is 0.2 mm to 0.25 mm when the electrical connector 100 in the related art clamps the solder ball 7, in order to enable the solder post 3 to reach the solder requirement when the solder ball 7 solders the circuit board 5, the height H2 of the second base 32 can also be set to be greater than 0.3 mm.

As shown in FIG. 7, the first base 31 is provided with a first flat surface 311. A first rounded chamfer 312 connects the first flat surface 311 and a side surface of the first base 31. Correspondingly, one side of the connecting portion 24 facing the accommodating space 26 is arc shaped and matches with the first rounded chamfer 312, thereby preventing from the collision between the connecting portion 24 and the solder post 3 to cause the scattering of the solder in the electrical connector 100 and lead to short-circuiting of the electrical connector 100 when the solder post 3 is installed in the accommodating space 26. The second base 32 is provided with a second flat surface 321. A second rounded chamfer 322 connects the second flat surface 321 and a side surface of the second base 32, and the second rounded chamfer 322 is located outside the accommodating space 26.

Figure 2:
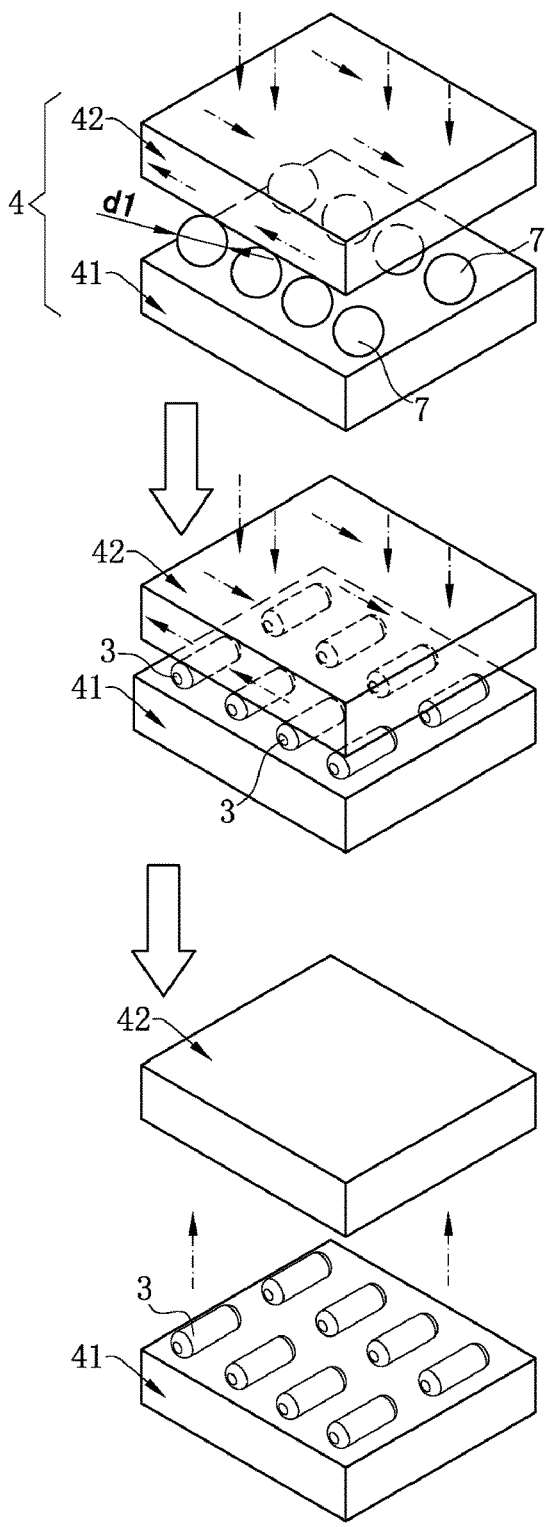
FIG. 2 is a perspective view of a process of a solder post being made of a solder ball in an electrical connector according to certain embodiments of the present invention.

As shown in FIG. 1 and FIG. 2, each of the solder posts 3 is made of one of multiple solder balls 7 via a jig 4. The jig 4 includes a platform 41 and a pressing member 42 located above the platform 41. The pressing member 42 moves back and forth in the horizontal direction. When the jig 4 is at a working state, the solder balls 7 are located on the platform 41, and the pressing member 42 downward abuts the solder balls 7. The pressing member 42 moves in a reciprocating manner in the horizontal direction to drive the solder balls 7 to roll, and the solder ball 7 is pressed by the pressing member 42 in the rolling process. Compared with the diameter d1 of the original solder ball 7, the solder ball 7 is gradually deformed, and the width of each stressed surface away from the gravity core of the solder ball 7 is gradually reduced. As shown in FIG. 1, the maximum width W of each solder post 3 is finally smaller than the original diameter d1 of the solder ball 7. Thus, a distance between the pressing member 42 and the platform 41 gradually decreases, and the pressing member 42 always gradually presses the solder balls 7 downward until the jig 4 realizes the preparation of the solder balls 7 into the solder posts 3 meeting the requirements. The jig 4 is structurally simple and high in working efficiency, and can prepare a plurality of solder balls 7 into the solder posts 3 in one step.

To sum up, the electrical connector 100 according to certain embodiments of the present invention has the following beneficial effects:

(1) Each solder post 3 is formed by a first base 31 and a second base 32 connected with each other. The clamping portion 25 clamps the first base 31. The first base 31 is located in the accommodating space 26. The second base 32 is located outside the clamping portion 25. A height H1 of the first base 31 and a height H2 of the second base 32 are both greater than one half of the maximum width W of the solder post 3. The height H1 of the first base 31 is smaller than the height H2 of the second base 32, thus ensuring that the amount of solder for connecting the clamping portion 25 and the terminal 2 and the circuit board 5 during the soldering is sufficient, and the stress on the solder post 3 when the clamping portion 25 clamps the solder post 3 is more stable. Since each solder post 3 has a height H greater than a diameter d1 of a solder ball 7 compared with the solder ball 7 of the same volume, and the maximum width W of the solder post 3 is smaller than the diameter d1 of the solder ball 7, the size of each accommodating hole 11 can be reduced, and the distance among the accommodating holes 11 is increased, such that the insulating body 1 can realize the densification of the accommodating holes 11.

(2) The height H2 of the second base 32 is greater than 0.15 mm. That is, a collapse distance is reserved to be greater than 0.15 mm when the second base 32 is molten, thereby ensuring the rational amount of solder and rational soldering space. Since a length L of the solder ball 7 extending out of the clamping portion 25 is 0.2 mm to 0.25 mm when the electrical connector 100 in the related art clamps the solder ball 7, in order to enable the solder post 3 to reach the solder requirement when the solder ball 7 solders the circuit board 5, the height H2 of the second base 32 can also be set to be greater than 0.3 mm.

(3) When each solder post 3 is installed in the accommodating space 26, due to the presence of the gaps 15 between the clamping arms 251 and the second side walls 14, when each solder post 3 is squeezed into a space between the two clamping arms 251, the clamping arms 251 can be prevented from being forced to push against the second side walls 14. Correspondingly, the stress of the clamping arms 251 is not transferred to the insulating body 1, and the damage of the insulating body 1 is avoided.

(4) A distance D2 between the two gaps 15 is greater than the distance D1 between the two first side walls 13, and the distance D1 between the two first side walls 13 is greater than a maximum width W of the solder post 3, such that each accommodating hole 11 is sufficient to accommodate the terminal 2 and the solder post 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   an insulating body, provided with a plurality of accommodating holes, wherein each of the accommodating holes is provided with a stopping block;
   a plurality of terminals, respectively accommodated in the accommodating holes, wherein each of the terminals is provided with a clamping portion and a main body portion, the main body portion is provided with a through hole, the through hole is provided with an elastic sheet, and the stopping block is configured to stop the elastic sheet; and
   a plurality of solder posts, wherein each of the solder posts is clamped by the clamping portion of one of the terminals, a height of each of the solder posts is greater than a maximum width of each of the solder posts, each of the solder posts is formed by a first base and a second base connected with each other, the clamping portion clamps the first base, and the second base is located outside the clamping portion.

2. The electrical connector according to claim 1, wherein a height of the first base and a height of the second base are both greater than one half of the maximum width of each of the solder posts.

3. The electrical connector according to claim 1, wherein a height of the second base is greater than a height of the first base, and the height of the second base is greater than 0.3 mm.

4. The electrical connector according to claim 1, wherein the main body portion is correspondingly provided with two extending arms at two sides of the through hole, configured to transmit signals between a chip module and a circuit board.

5. The electrical connector according to claim 4, wherein a connecting portion connects the two extending arms and the clamping portion, and the connecting portion is provided with an anti-siphon structure located above the first base.

6. The electrical connector according to claim 1, wherein a horizontal cross-section of each of the solder posts is a circle.

7. The electrical connector according to claim 6, wherein:
each of the terminals is provided with a connecting portion connected to the clamping portion, the clamping portion and the connecting portion surroundingly form an accommodating space, and the first base is located in the accommodating space;
the first base is provided with a first flat surface, a first rounded chamfer connects the first flat surface and a side surface of the first base, and correspondingly, one side of the connecting portion facing the accommodating space is arc shaped and matches with the first rounded chamfer; and
the second base is provided with a second flat surface, a second rounded chamfer connects the second flat surface and the side surface of the second base, and the second rounded chamfer is located outside the accommodating space.

8. The electrical connector according to claim 1, wherein each of the solder posts is made of one of a plurality of solder balls via a jig, the jig comprises a platform and a pressing member located above the platform, the pressing member moves back and forth in a horizontal direction, the solder balls are located on the platform, and the pressing member downward abuts the solder balls.

9. The electrical connector according to claim 8, wherein the pressing member presses the solder balls for multiple times and gradually presses the solder balls downward so as to make the solder balls into the solder posts.

10. The electrical connector according to claim 1, wherein a horizontal cross-section of each of the solder posts is a polygon.

11. The electrical connector according to claim 1, wherein each of the accommodating holes is provided with two first side walls opposite to each other, the clamping portion is provided between the two first side walls, side surfaces of the first base face the first side walls, and a distance between the two first side walls is greater than the maximum width of each of the solder posts.

12. The electrical connector according to claim 11, wherein:
each of the accommodating holes is provided with two second side walls opposite to each other, the second side walls are connected with the first side walls, and the two second side walls and the two first side walls jointly surroundingly form the accommodating hole; and
the clamping portion is provided with two clamping arms opposite to each other, the clamping arms face the second side walls, and two gaps are respectively formed between the clamping arms and the second side walls.

13. The electrical connector according to claim 12, wherein a distance between the two gaps is greater than the distance between the two first side walls.

14. The electrical connector according to claim 1, wherein the clamping portion has two clamping arms opposite to each other, a free end of each of the clamping arms faces the first base and is provided with at least one stopping portion, and the stopping portion abuts the first base.

15. An electrical connector, comprising:
an insulating body, provided with a plurality of accommodating holes;
a plurality of terminals, respectively accommodated in the accommodating holes, wherein each of the terminals is provided with a clamping portion and a connecting portion connected to the clamping portion, and the clamping portion and the connecting portion surroundingly form an accommodating space; and
a plurality of solder posts, wherein each of the solder posts is clamped by the clamping portion of one of the terminals, a height of each of the solder posts is greater than a maximum width of each of the solder posts, each of the solder posts is formed by a first base and a second base connected with each other, the clamping portion clamps the first base, and the second base is located outside the clamping portion,
wherein the first base is located in the accommodating space, the first base is provided with a first flat surface, a first rounded chamfer connects the first flat surface and a side surface of the first base, and correspondingly, one side of the connecting portion facing the accommodating space is arc shaped and matches with the first rounded chamfer; and
wherein the second base is provided with a second flat surface, a second rounded chamfer connects the second flat surface and the side surface of the second base, and the second rounded chamfer is located outside the accommodating space.

16. The electrical connector according to claim 15, wherein a horizontal cross-section of each of the solder posts is a circle.

17. The electrical connector according to claim 15, wherein each of the terminals is provided with a main body portion, the main body portion is provided with a through hole, the through hole is provided with an elastic sheet, each of the accommodating holes is provided with a stopping block configured to stop the elastic sheet, and the main body portion is correspondingly provided with two extending arms at two sides of the through hole, configured to transmit signals between a chip module and a circuit board.

18. An electrical connector, comprising:
an insulating body, provided with a plurality of accommodating holes, wherein each of the accommodating holes is provided with two first side walls opposite to each other and two second side walls opposite to each other, the second side walls are connected with the first side walls, and the two second side walls and the two first side walls jointly surroundingly form the accommodating hole;
a plurality of terminals, respectively accommodated in the accommodating holes, wherein each of the terminals is provided with a clamping portion between the two first side walls, the clamping portion is provided with two clamping arms opposite to each other, the clamping arms face the second side walls, and two gaps are respectively formed between the clamping arms and the second side walls; and
a plurality of solder posts, wherein each of the solder posts is clamped by the clamping portion of one of the terminals, a height of each of the solder posts is greater than a maximum width of each of the solder posts, each of the solder posts is formed by a first base and a second base connected with each other, the clamping portion clamps the first base, the second base is located outside the clamping portion, side surfaces of the first base face the first side walls, and a distance between the two first side walls is greater than the maximum width of each of the solder posts.

19. The electrical connector according to claim 18, wherein a distance between the two gaps is greater than the distance between the two first side walls.

20. The electrical connector according to claim 18, wherein each of the accommodating holes is provided with a stopping block, each of the terminals is provided with a main body portion, the main body portion is provided with a through hole, the through hole is provided with an elastic sheetand the stopping block is configured to stop the elastic sheet.

\* \* \* \* \*